United States Patent [19]
Brittain et al.

[11] Patent Number: 5,450,869
[45] Date of Patent: Sep. 19, 1995

[54] HEATER MECHANISM INCLUDING A LIGHT COMPACT THERMOELECTRIC CONVERTER

[75] Inventors: Wayne M. Brittain, Baltimore; Richard G. Hannah, Lutherville; John H. Himes, Joppa; Alfred H. LaPorte, Phoenix, all of Md.; Joseph B. Moore, New Freedom, Pa.

[73] Assignee: Volvo Flygmotor AB, Trollhattan, Sweden

[21] Appl. No.: 857,590

[22] Filed: Mar. 25, 1992

[51] Int. Cl.⁶ .......................................... H01L 35/32
[52] U.S. Cl. ................................. 136/203; 136/204; 136/205; 136/208; 136/209; 136/210; 136/211; 136/212; 136/224; 310/306; 310/307; 322/2 R
[58] Field of Search ............... 136/200, 205, 208, 209, 136/210, 211, 212, 224, 203, 204, 242; 310/306, 307; 322/2 R

[56] References Cited

U.S. PATENT DOCUMENTS

| | | | |
|---|---|---|---|
| 2,362,258 | 11/1944 | Findley et al. | 126/110 |
| 2,362,259 | 11/1944 | Findley | 171/125 |
| 2,363,168 | 11/1944 | Findley | 126/110 |
| 2,390,578 | 12/1945 | Findley | 136/4 |
| 2,480,404 | 8/1949 | Findley et al. | 136/4 |
| 2,519,241 | 8/1950 | Findley | 126/116 |
| 3,082,275 | 3/1963 | Talaat | 136/4 |
| 3,129,116 | 4/1964 | Corry | 136/4 |
| 3,150,656 | 9/1964 | Huber | 126/110 |
| 3,185,201 | 5/1965 | Herbst et al. | 158/4 |
| 3,269,873 | 8/1966 | Dent | 136/208 |
| 3,325,312 | 6/1967 | Sonntag, Jr. | 136/212 |
| 3,496,028 | 12/1970 | Norton et al. | 136/211 |
| 3,546,025 | 12/1970 | Fredrick et al. | 136/205 |
| 3,714,539 | 1/1973 | Hampl, Jr. | 321/1.5 |
| 4,753,682 | 6/1988 | Cantoni | 136/212 |
| 4,843,273 | 6/1989 | Dammers et al. | 310/306 |

OTHER PUBLICATIONS

Nystrom, T. L. et al, "High Power Density Thermoelectric Power Sources", Intersociety Energy Conversion Engineering Conference, Aug. 1971, pp. 731–740.

Primary Examiner—Donald P. Walsh
Assistant Examiner—Chrisman D. Carroll
Attorney, Agent, or Firm—Keck, Mahin & Cate

[57] ABSTRACT

A heater mechanism incorporating a thermoelectric converter for use with a self-powered, solid, liquid or gaseous fueled, heater. During operation of the heater mechanism the thermoelectric converter supplies sufficient electrical power to (a) sustain the heater in operation, (b) maintain the starter battery at full charge, and (c) provide auxiliary power to remove and transport heat to desired locations away from the heater. The converter is a highly compact design (high power output per unit volume of space) and lends itself to high volume (mass production) and automated assembly techniques to produce it inexpensively. The thermoelectric converter is made of fewer components than prior art devices. A number of components in the thermoelectric stack serve dual or even multi-functions. The thermoelectric stack components are bonded or mounted together in such a manner as to permit handling as a unit.

8 Claims, 12 Drawing Sheets

FIG. 17

HEATER MECHANISM INCLUDING A LIGHT COMPACT THERMOELECTRIC CONVERTER

FIELD OF THE INVENTION

The present invention relates to a self-powered heater mechanism including a thermoelectric converter for use with motor vehicles (such as automobiles, trucks, buses, military vehicles, vans, trailers, RV's and mobile homes), boats, cottages and weekend homes, combination remote power heating sources as in survival shelters, military shelters and temporary housing, military decoy heaters, and military stoves.

BACKGROUND OF THE INVENTION

A heater mechanism of the type to which the present invention relates, incorporates a thermoelectric converter for supplying electrical power for a typical solid, liquid or gas fueled heater for (a) sustaining the heater operation after a brief start-up period; (b) supplying power for providing fuel to the heater, for cooling the heater, removing waste heat from the converter and transporting the heat to a useful location remote from the heater, passenger compartment blower; and (c) recharging the start-up battery to insure adequate battery energy for subsequent start-up operations. The removal (or rejection) of heat from the thermoelectric converter cold side and the transport of the heat may be accomplished by either liquid or gaseous transport media (including heat pipes) and by pumping and/or blower devices. However, for highly compact self-powered heater systems either a liquid cooled system or a heat pipe cooled system would be required.

Prior thermoelectric converter designs employed a series arrangement of the components from the heat source to the heat sink. In these designs, the heat was directed in series from the combustion zone through the hot frame (or heat distribution member), thermoelectric stack elements, piston (or cold side compliance member), module bar or heat sink (or heat exchanger) and then to the coolant (gas or liquid). This series arrangement of components whether in a cylindrical or rectangular configuration, uses more volume than necessary and is therefore, unnecessarily large and bulky.

Thermoelectric stacks of prior devices have consisted of one of two basic approaches. In a first approach, a relatively large number of individual parts were assembled laboriously by hand stacking one part on top of another and ultimately the stacked parts were placed under spring pressure at final assembly. This approach was called a pressure contacted system, and because of the many loose parts, does not lend itself readily to automated assembly. In a second approach, several parts of the thermoelectric stack are bonded together at the hot side as individual couples. The couples are then installed into the converter as a matrix usually in a solid thermal insulation piece. The thermoelectric circuit is then completed by a second bonding step which attaches cold side electrical strips to the couples. Other loose parts must be added to this bonded component, that is, hot side dielectric material, cold side pistons, springs and heat sink(s), to complete the converter. The large number of parts and multiple operations do not lend themselves to mass production or automated assembly methods.

Furthermore, prior art, as known from patents U.S. Pat. No. 4,843,273 and 4,753,682 etc., has not addressed the problems of designing self-powered heaters for use in vehicle engine compartments where space and to some extent weight are at a premium; nor have they addressed the even more critical design considerations of reducing the parts count, or identifying cost effective fabrication and assembly methods in order to make the thermoelectric converter mass producible commercially.

SUMMARY OF THE INVENTION

The present invention overcomes the drawbacks and disadvantages of the prior art systems and approaches by providing a heater mechanism that incorporates a thermoelectric converter that arranges the components and functions in a unique parallel heat flow design in order to achieve a minimum diameter or minimum thickness converter. In particular, the heat transfer from the cold end compliance members (often called pistons or followers) is designed to be in parallel to the coolant. A comparison of the followers of the present invention with prior devices of series heat flow is shown in FIGS. 1a and 1b.

Figure 1A:
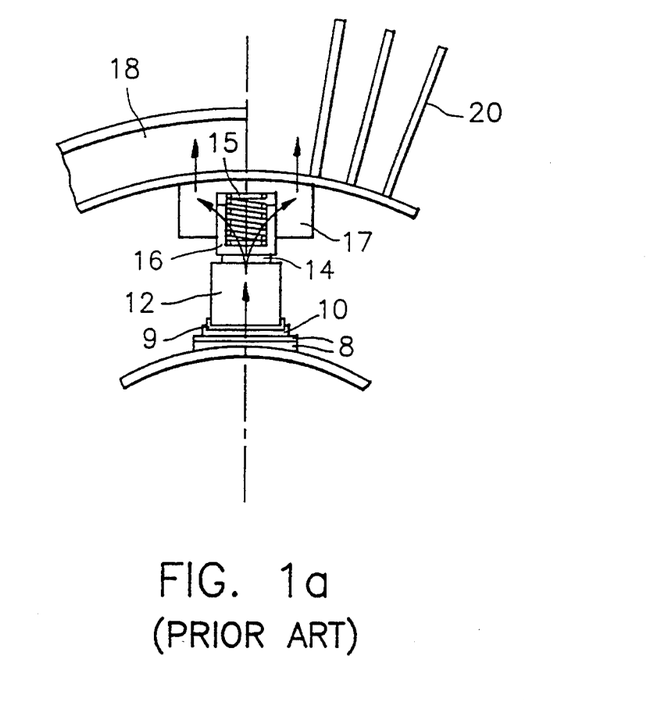
FIGS. 1a and 1b are schematic views comparing prior art series heat transfer with the novel parallel heat transfer of the present invention.
Figure 1B:
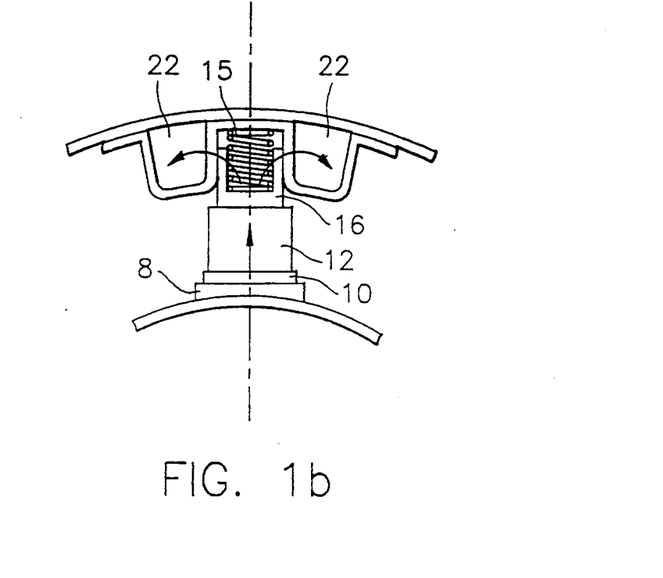

As shown in FIG. 1a, a stack, schematically shown, comprises dielectric insulator and thermal compensator (as two parts) 8, hot shoe 10, contact cap 9, thermoelectric element 12, cold strap 14, follower 16, springs 15, module bar (or heat sink bar) 17 and cooling annulus 18 or cooling fins 20. The heat flow is shown by the arrows and passes serially through the stack, namely, in sequence through dielectric insulator and thermal compensator 8, hot shoe 10, contact cap 9, element 12, cold strap 14, follower 16, heat sink bar 17 and annulus 18 or fins 20. In contradistinction, according to the invention, a pair of cooling channels 22 abut the follower 16 on both sides and lie in substantially the same peripheral region. No contact cap 9, no cold strap 14 and no module bar (or heat sink) 17 as such are used. Also, the dielectric strip and thermal compensator 8 functions are combined into one element. The heat flow, shown by the arrows branches into two parallel paths through the pair of channels 22 abutting follower 16. The design and methods of fabricating the components which enable this parallel function is one of the features of the present invention. Another unique feature of the present invention is the dual function of the follower. In the present invention the follower carries the current from one element to another as well as directs the heat energy whereas in prior art the cold strap performed the function of current carrying. The present invention also eliminates the need for a module bar (or heat sink bar) 17 to transport the heat flow from the follower to the cooling annulus or fins because the follower dissipates the heat directly to the two cooling channels 22. The present invention provides the solution of an extremely compact self-powered heater for incorporation into the very tightly packed modern day automotive and/or other vehicle engine compartment, and also embodies a cost effective, mass producible heater incorporating a novel thermoelectric converter design.

Figure 1C:
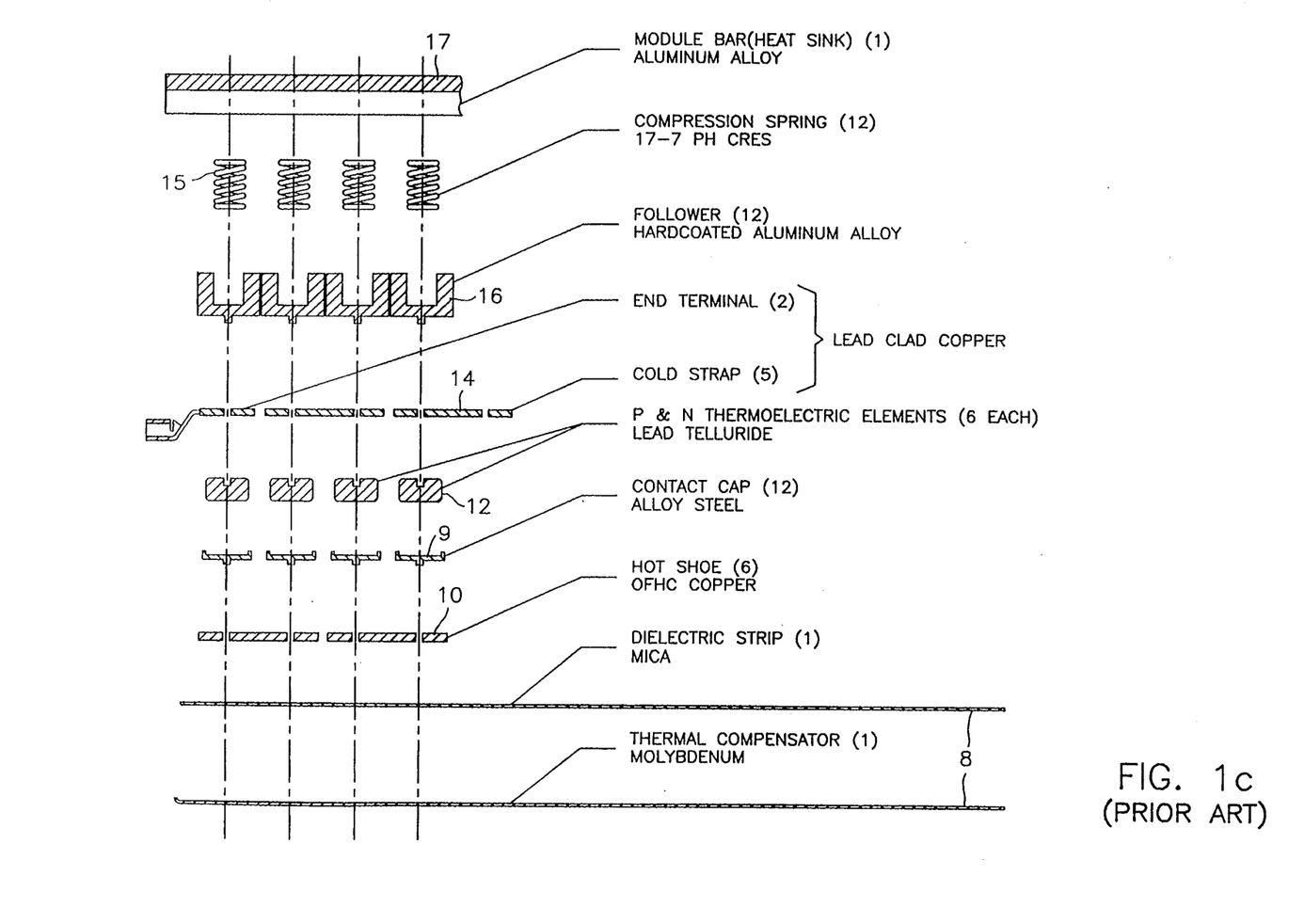
FIGS. 1c and 1d are partial views of a thermoelectric row comparing the number of parts used in prior art with the greatly reduced number required for the present invention.
Figure 1D:
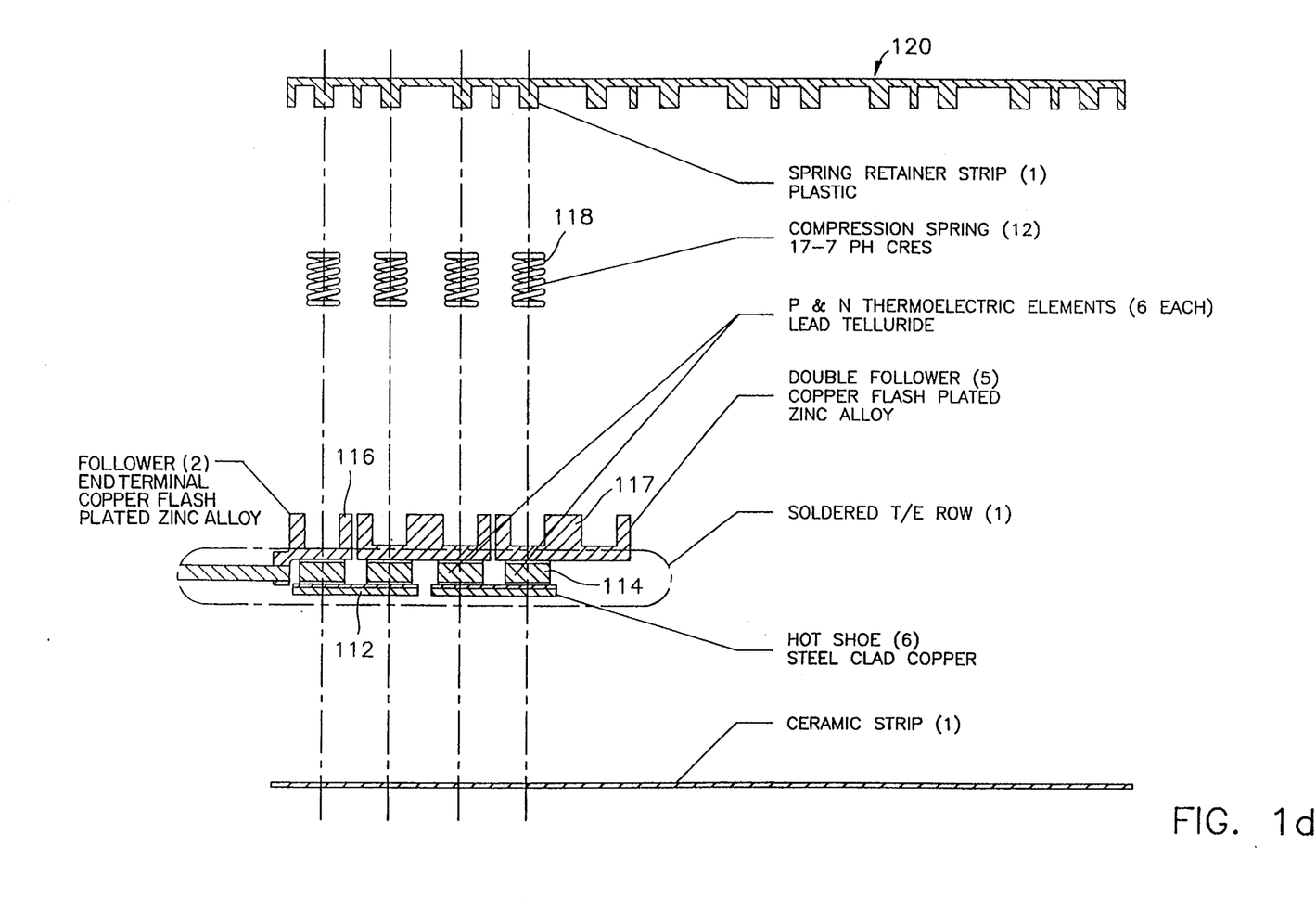

The present invention reduces the number of parts in the thermoelectric stack without loss of function. The present invention reduces the number of parts per thermoelectric row from 64 for prior art to 39 (compare FIGS. 1c and 1d). Further, since the number of thermoelectric rows in a typical converter is 32 or more, the total parts saving is 800 parts or more. The present invention also teaches methods to bond, attach or otherwise integrate all stack parts to provide a single row of couples which can be handled as a unit for shipping, handling and automated assembly operations. The present invention embodies methods of fabrication of individual stack parts which not only provide multiple functions but also drastically lower costs when produced in the large numbers associated with the automotive industry.

The design of the cold end channel as a novel corrugated cylinder enables volume reduction of the converter. Thermoelectric stack components (rows) are inserted into the inner channels defined by the corrugated cylinder, whereas the outer defined corrugations serve as liquid coolant channels to transfer the waste heat from the thermoelectric circuit to the coolant and to transport it away to the vehicle.

Current auxiliary vehicle heaters which permit warming up and defrosting of the vehicle prior to start-up utilize battery power for periods of ½ hour to 1 hour or more for each such usage. Unless the vehicle is subsequently driven a sufficient distance to recharge the battery, the battery can quickly become discharged to the point where it is incapable of starting the vehicle. The novel thermoelectric powered auxiliary heater solves this problem by restoring the battery energy during the heater operation period. In many countries today and also in some states of the U.S.A. there are strict laws against idling an automobile or truck engine for all but very short periods. Thus, the thermoelectric (self-powered) heater serves as an antipollution device as well as a fuel saving device. Taxis, limousines, and other special service vehicles are particularly well served by this type of heater.

DETAILED DESCRIPTION OF THE PREFERRED EMBODIMENT

Figure 2:
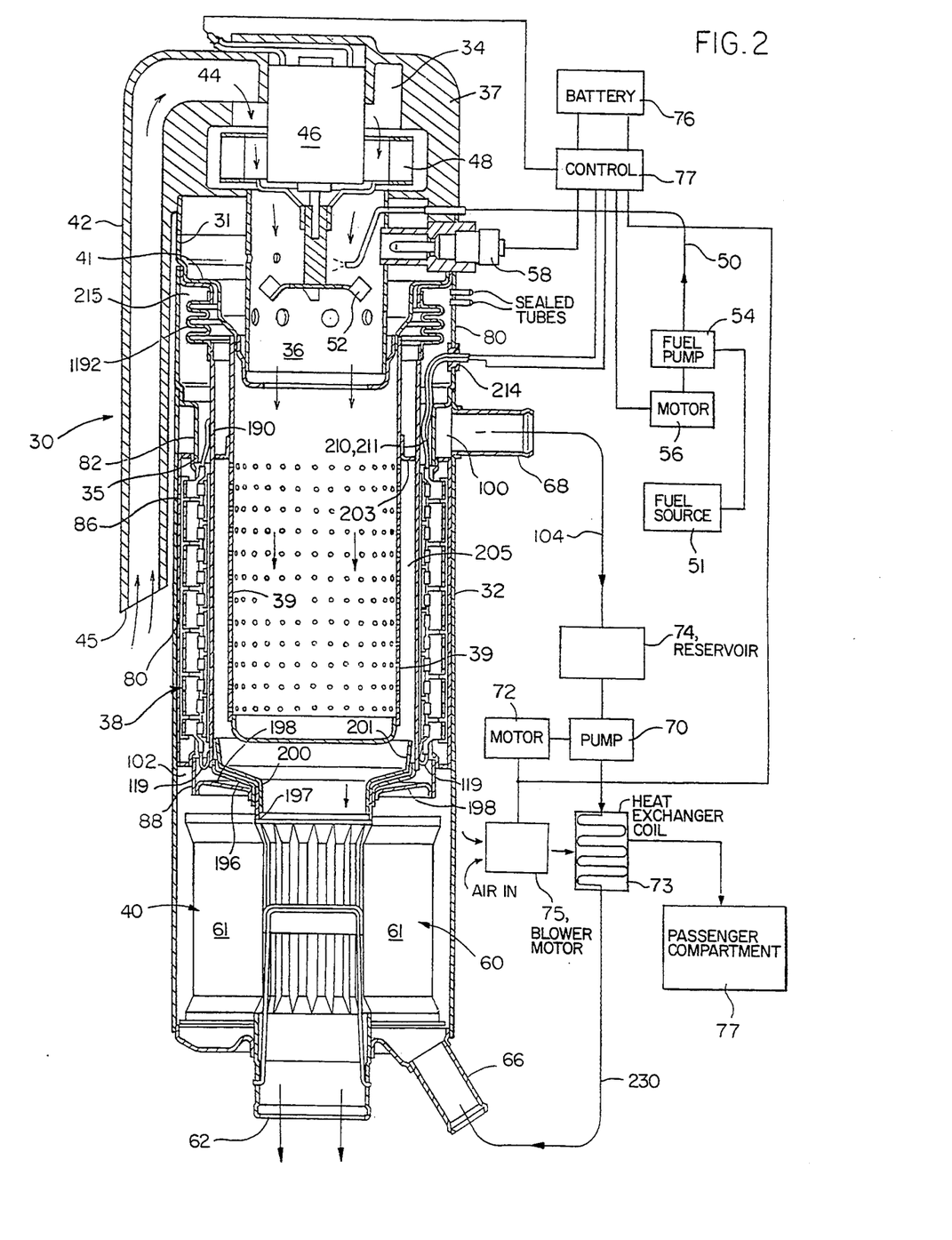
FIG. 2 is a cross sectional view illustrating a heater mechanism according to the present invention.
Figure 3:
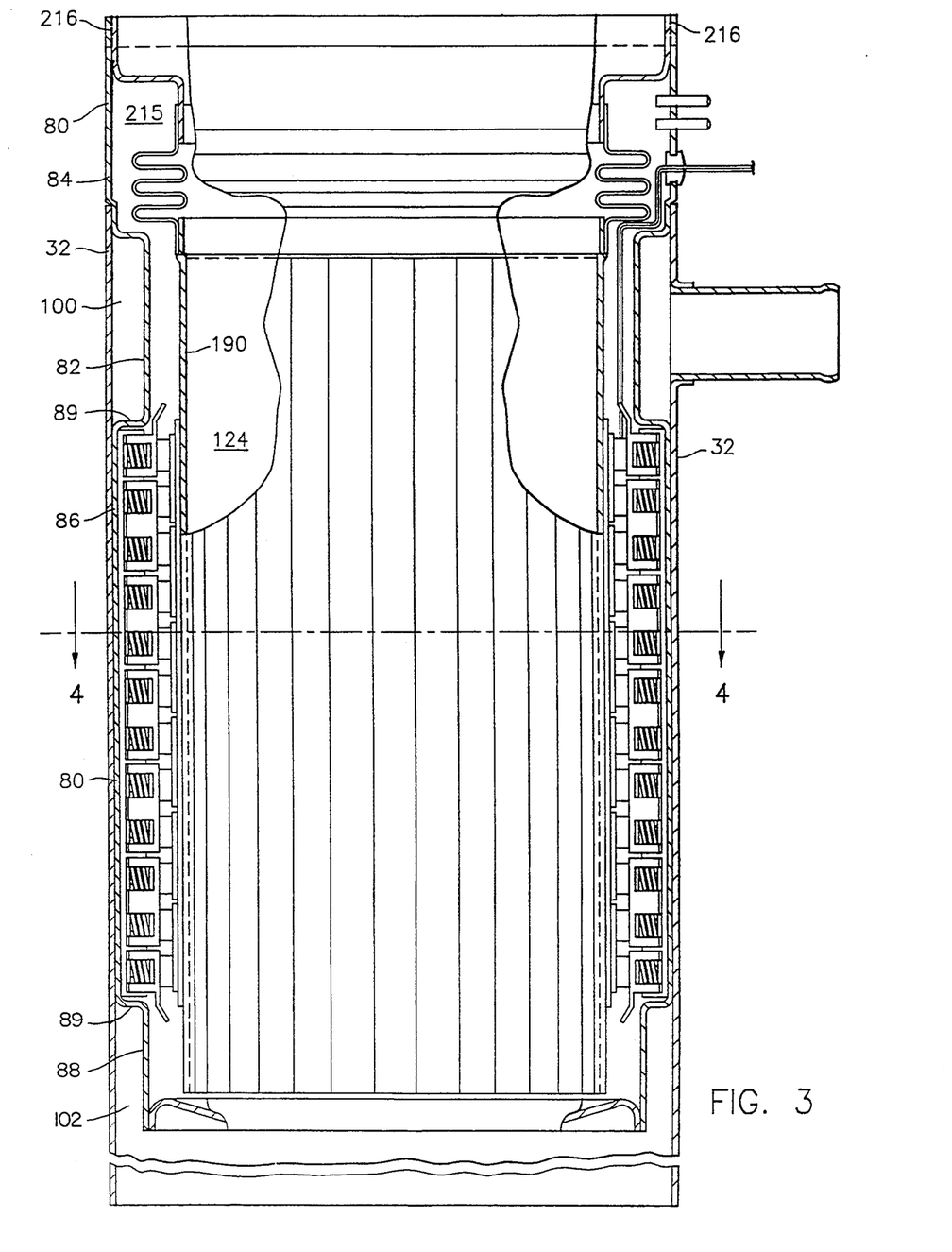
FIG. 3 is a view partly in section showing the thermoelectric converter of the present invention.
Figure 4:
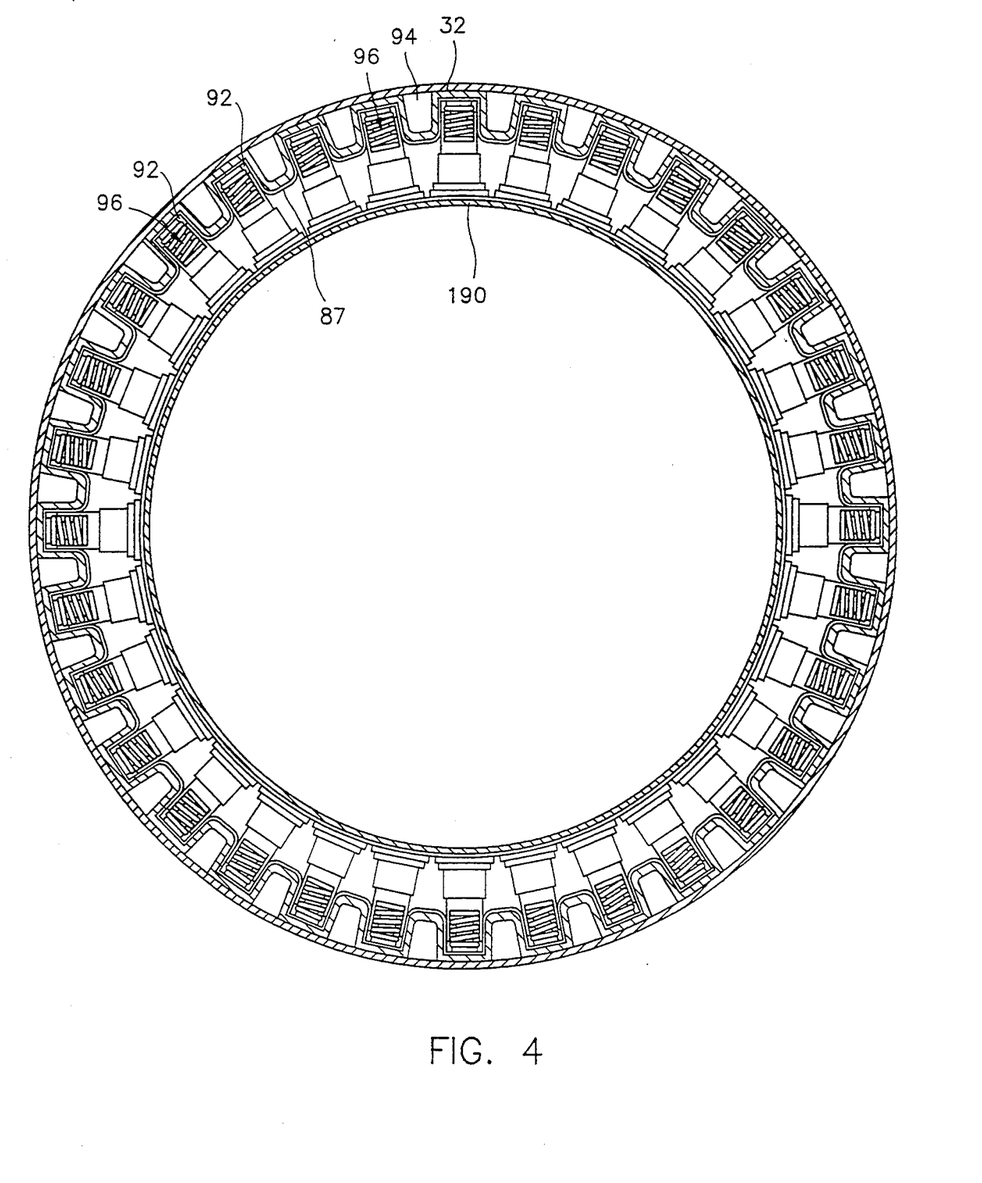
FIG. 4 is a view in section taken along line 4—4 of FIG. 3.

Referring now to the drawings in detail, FIGS. 2-4 illustrate a preferred embodiment of the present invention. As shown, a heater mechanism generally designated as 30, consists of an outer shell or housing 31 which is sealed to the hermetic seal 216 formed between the front ends of cold frame 80 and hot frame 190. A head 37 is sealed to the top of shell 31. An air introduction compartment 34 is defined in head 37. A combustion chamber 36 is mounted in head 37 and a perforated burner mantle 39 is carried by brackets 41 attached to shell 31 and head 37. The combustion gases are routed through slotted holes or circular holes in the burner mantle 39 past hot frame 190, through heat exchanger 60 and exhausted out outlet 62. Shell 32 is attached at its front end to the dogleg at the front of cold frame 80 and shell 32 extends to the rear end of the heater. A thermoelectric generator 38 and a heat exchange-exhaust compartment 40 are located in shell 32. An inlet air pipe 42, which may originate at its free end 45 about midway along the heater mechanism, extends axially along the housings 31, 32, and cold frame 80 and connects coaxially to opening 44 in head 37 leading into compartment 34 located at one end of the heater mechanism 30.

Within compartment 34 is an electric motor 46 driving a fan 48. Air is drawn into opening 44 by fan 48 and is exhausted into combustion chamber 36. The drive of motor 46 extends into chamber 36 and a distributing paddle wheel 52 is mounted to motor 46 to be driven thereby directly or through gearing. Fuel pumped from a fuel source 51 such as the gas tank of the vehicle is fed by pump 54 driven by electric motor 56 into combustion chamber 36 by line 50. The fuel is discharged onto paddle wheel 52 whereupon it is atomized or broken up for mixing with the air flowing through combustion chamber 36 by the action of fan 48. An electric glow element or like ignition element 58 projects into combustion chamber 36 for igniting the combustible fuel-air mixture producing hot combustion gases which flow past hot frame 190 and heat exchanger 60 in compartment 40 and are exhausted through outlet 62. Both the thermoelectric generator 38 and compartment 40 are jacketed by shell 32 and an inlet tube 66 and outlet tube 68 are provided for circulation of a cooling medium such as water or other anti-freeze coolant as used e.g. in an automobile engine. A pump 70 driven by an electric motor 72 pumps coolant via heat exchanger coil 73 into inlet 66 and returns same from outlet 68 to a reservoir 74 which could be an automobile radiator. A blower motor 75 takes in air, blows it across the coil 73 and into a passenger compartment 77. A battery 76 is conventionally electrically connected with the usual controls 77 to supply power to motors 46, 56 and 72 and electrical connections with the usual controls are provided between generator 38 and battery 76 to recharge battery 76 and to provide the power to operate motors 46, 56 and 72.

The components of the heater mechanism 30 except for the thermoelectric generator 38 are generally known and conventional. The air pipe 42, fan 48, fan motor 46, fuel pipe 50, fuel pump motor 56, combustion chamber 36, ignition device 58, water outlet pipe 68, water inlet pipe 66 and water pump motor 72 are all of conventional design. The heat exchanger or transfer element 60 can be of a known star chamber design or any other conventional known design or simply a central tube provided with radial fins 61 as shown.

The thermoelectric generator or converter 38 will now be described in detail (see FIG. 3). The cold side of generator 38 consists of a cylinder 80 having a reduced section 82 adjacent and slightly spaced from its front end 84, a central corrugated section 86 and a reduced section 88 at its rear end, shoulders 89 divide section 86 from sections 82 and 88. A dogleg is formed in front end 84. In section 86, see FIG. 4, the corrugations are pressed inwardly to define channels 92 separated by troughs 94. The inner surface of section 86 is coated with an electrically insulating but good heat transfer material 87. Strips or rows 96 of thermoelectric subassemblies are fitted on their cold sides into channels 92. An outer cylindrical shell 32, fits closely over the central corrugated section 86, closing the troughs 94 on their outer sides, thereby defining flow paths for coolant. Shell 32 is sealed to cylinder 80 at its dogleg and shell 32 is spaced from reduced section 82 and reduced rear end 88 to define manifolds 100 and 102. An outlet tube 68 connects to manifold 100 which is in fluid communication with one end of each trough 94. The other end of each trough 94 is in fluid communication with manifold 102.

Figure 5A:
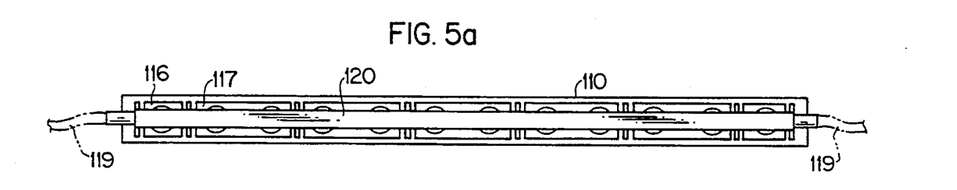
FIG. 5a is a top plan of the subassembly shown in FIG. 5b.
Figure 5B:
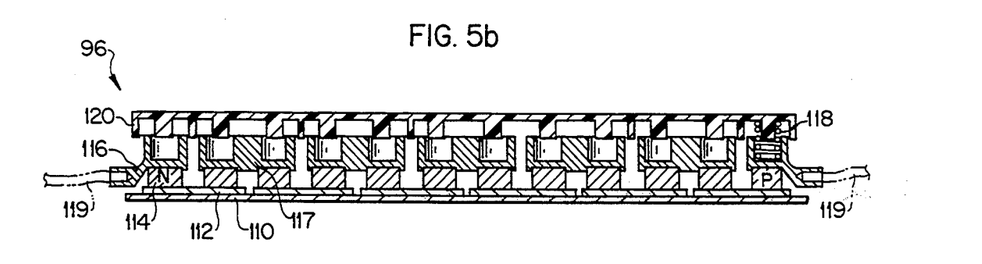
FIG. 5b is a section through a subassembled thermoelectric converter strip or row according to the present invention.
Figure 6:
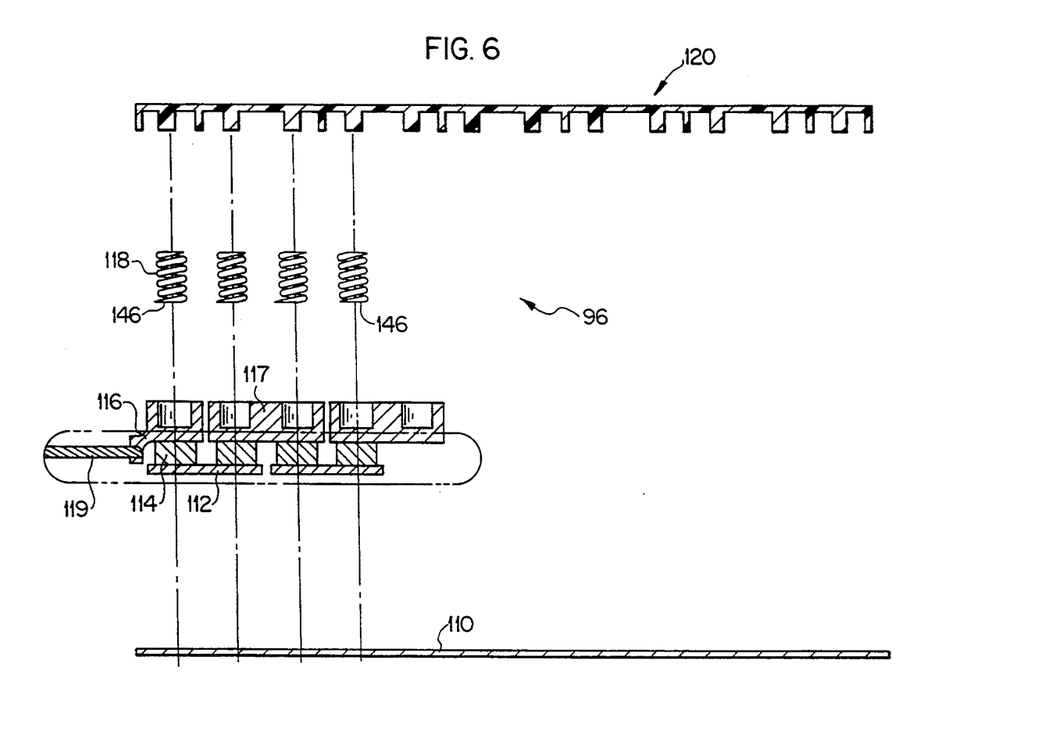
FIG. 6 is an exploded view showing the subassembly of FIGS. 5a and 5b.
Figure 7:
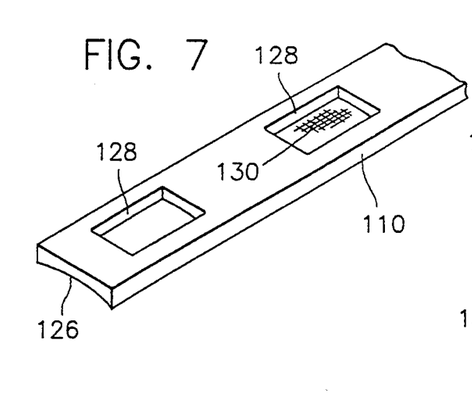
FIG. 7 is a perspective view illustrating the hot side dielectric strip according to the present invention.
Figure 8:
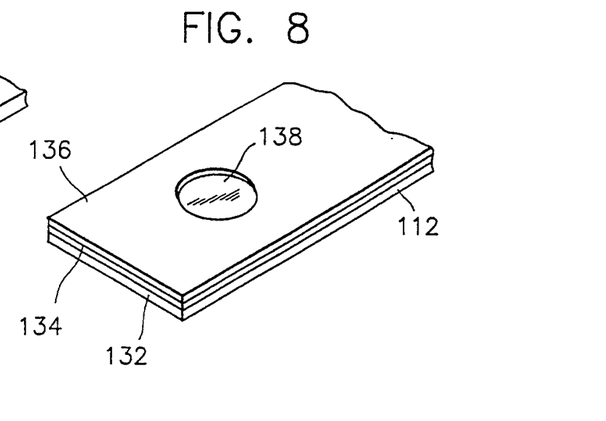
FIG. 8 is a perspective view illustrating the hot shoe according to the present invention.

The thermoelectric subassemblies, strips or rows 96, are shown in detail in FIGS. 5a and 5b to 14. Referring first to FIGS. 5a and 5b, the subassemblies consist of a hot side dielectric strip 110, hot shoes 112, thermoelectric elements 114, pistons or followers 116, 117, springs 118 and a spring retainer strip 120. Strip 110 is composed of alumina or other electrically insulating material with good thermal transfer properties. The underside of strip 110 is profiled to fit hot frame 124 which is essentially cylindrical but could be provided with axially extending flats on its outer periphery. If frame 124 is cylindrical, strip 110 has an arcuate underside 126. The top side of strip 110 can have rectangular recesses or depressions 128 shaped to receive a hot shoe. Also portions of the top side can be metallized, such as the bottom of recess 128, as shown at 130, to enable a hot shoe to be solder bonded in a conventional way to strip 110, or attached by a ceramic cement. Hot shoes 112 are rectangular parallelepiped in shape and sized to fit or receive two thermoelectric elements 114. The hot shoe 112 can consist of a multi-laminar structure, such as, a bottom layer of copper 132, an intermediate layer of steel 134 clad or bonded to the bottom layer of copper and a top layer of tin 136 clad or bonded to the steel layer. The top layer 136 can be provided with circular depressions or recesses 138 sized to receive the disc shaped thermoelectric elements 114. As is well known, the thermoelectric elements are composed of a suitable material having thermoelectric properties, such as lead telluride, and are doped in a known way to alternate in the subassemblies between P-type and N-type.

Figure 9:
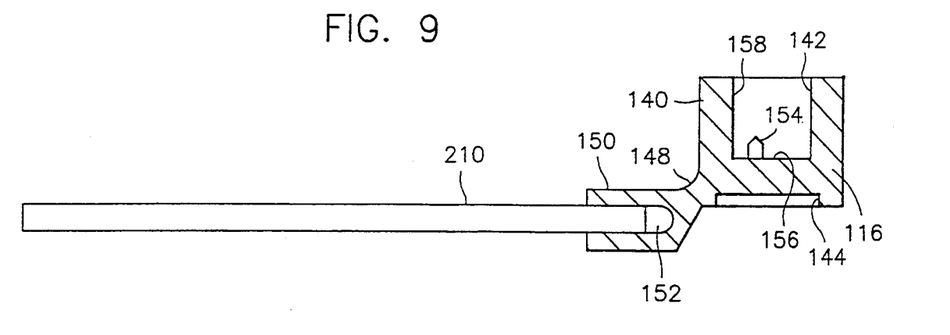
FIG. 9 is a view in section showing an end terminal follower according to the present invention.
Figure 10:
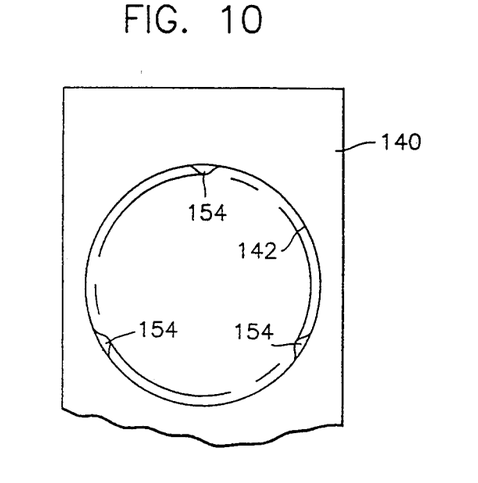
FIG. 10 is a top view of the end terminal follower shown in FIG. 9.

The pistons or followers 116, 117 are of two types, single 116 and double 117. Single followers 116 are used at each end of a subassembly and doubles 117 are used at intermediate positions in the rows. A single type follower 116 is shown in FIGS. 9 and 10 and consists of a solid block 140 of parallelepiped form defining a large central cylindrical recess 142 in its top and a shallow central cylindrical recess 144 in its bottom. Recess 144 is sized and shaped to fit the top of its associated thermoelectric element 114. Recess 142 receives a compression spring 118. Projecting from each end of a row is a terminal 150 defining a recess 152 for receiving an electrical lead to make a connection to each end of a row. The terminal may be flat or any suitable configuration to which an electrical lead wire or ribbon may be soldered, brazed, welded, crimped or otherwise attached. Spaced around the bottom of recess 142 are three equally spaced radially extending ribs 154 that extend radially in toward the center of the recess a short distance. The ribs 154 extend from the bottom surface 156 of recess 142 up the side wall 158 for a sufficient distance to capture and hold the end coil 146 of spring 118 when received in recess 142. Alternatively, equally spaced protuberances may project from side wall 158 a short distance spaced above the bottom 156 to serve the same purpose.

Figure 11:
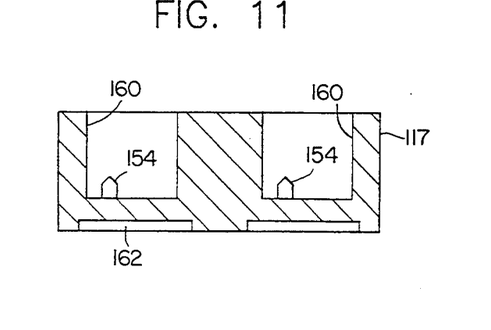
FIG. 11 is a view in section of a double follower according to the present invention.

The double type followers 117, shown in FIG. 11, are of elongated rectangular parallelepiped shape and define a pair of longitudinally spaced cylindrical recesses 160 provided with ribs 154 to receive and capture springs 118 and longitudinally spaced shallow cylindrical recesses 162 shaped to fit or receive the tops of two associated disc shaped thermoelectric elements 114.

The followers 116, 117 are composed of an electrically conductive material such as copper, nickel and the like. As already noted a single follower 116 is used at each end of a row and double followers 117 are used at intermediate positions. The thermoelectric elements 114 alternating between N- and P-types are soldered or otherwise bonded or positioned in pairs on their bottom surfaces in the depressions 138 in the hot shoes 112 (six are shown in one row). The top surfaces of the elements 114 are soldered or otherwise bonded in the depressions 144 of single follower 116 (two are shown in one row) and recesses 162 of double followers 117, (five are shown in one row). By alternating the elements 114 (N- and P-types) and using single followers 116 at row ends, a straight through electrical path is created from the follower 116 at one end of the row to the follower 116 at the other end of the row. In the intermediate positions of a row, the hot shoes 112 and the followers 117 are overlapped and offset or staggered in the longitudinal direction of the row.

Figure 12:
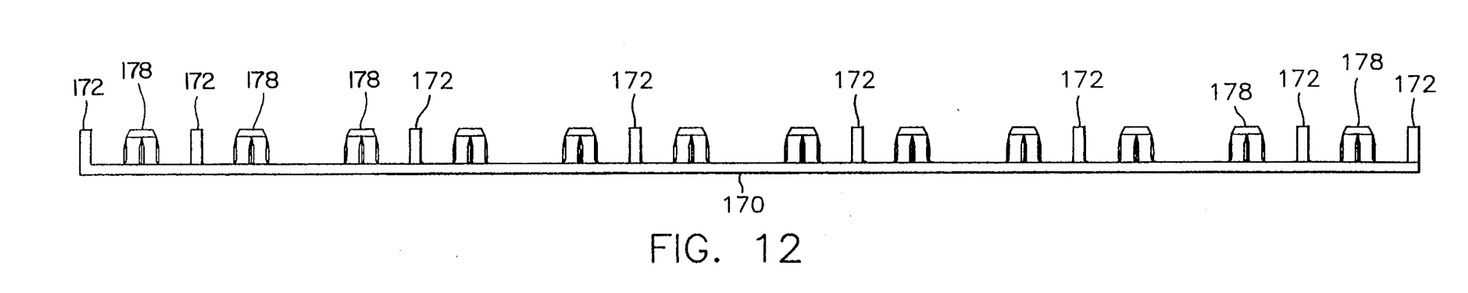
FIG. 12 is a side elevation showing the spring retainer strip according to the present invention.
Figures 13, 14, 14A:
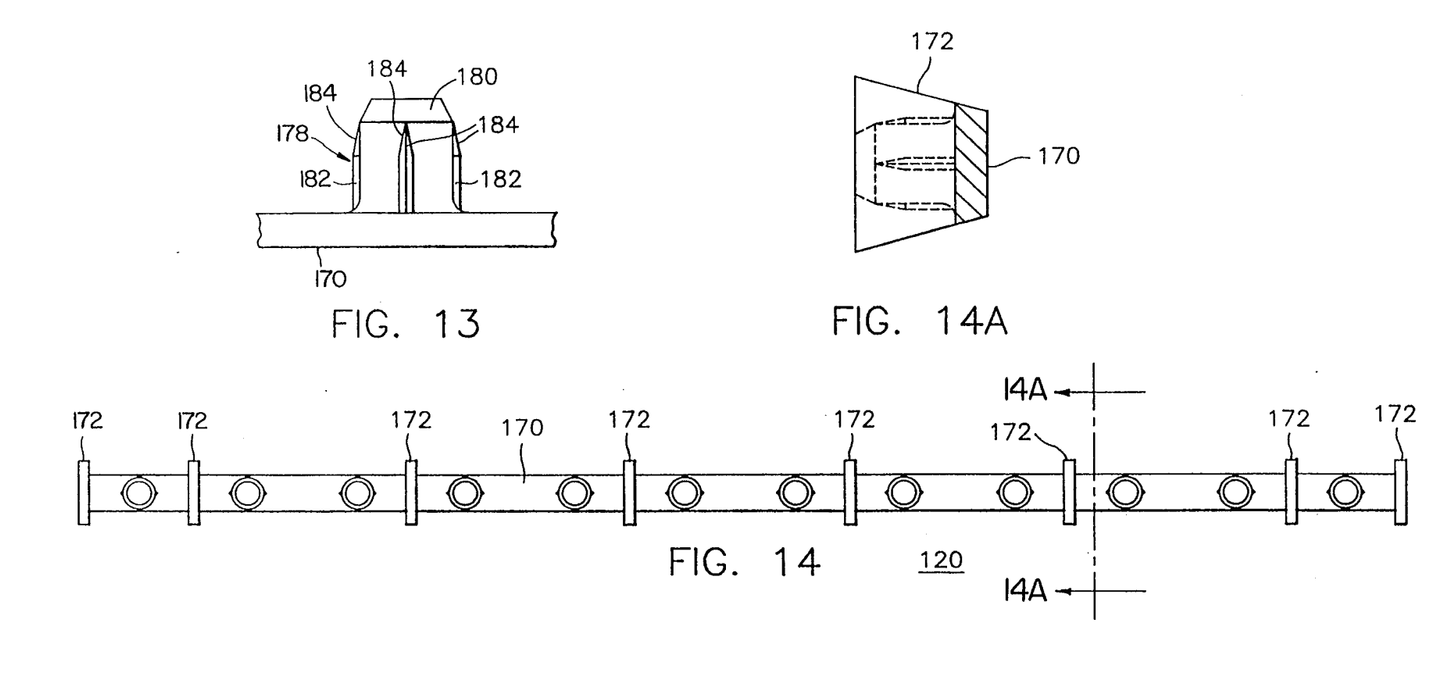
FIG. 13 is an enlarged detail of a single projection of the spring retainer strip shown in FIG. 12.
FIG. 14 is a top view of the spring retainer strip shown in FIG. 13.
FIG. 14A is a section of the spring retainer strip shown in FIG. 14 indicated at line 14A—14A.
Figure 15:
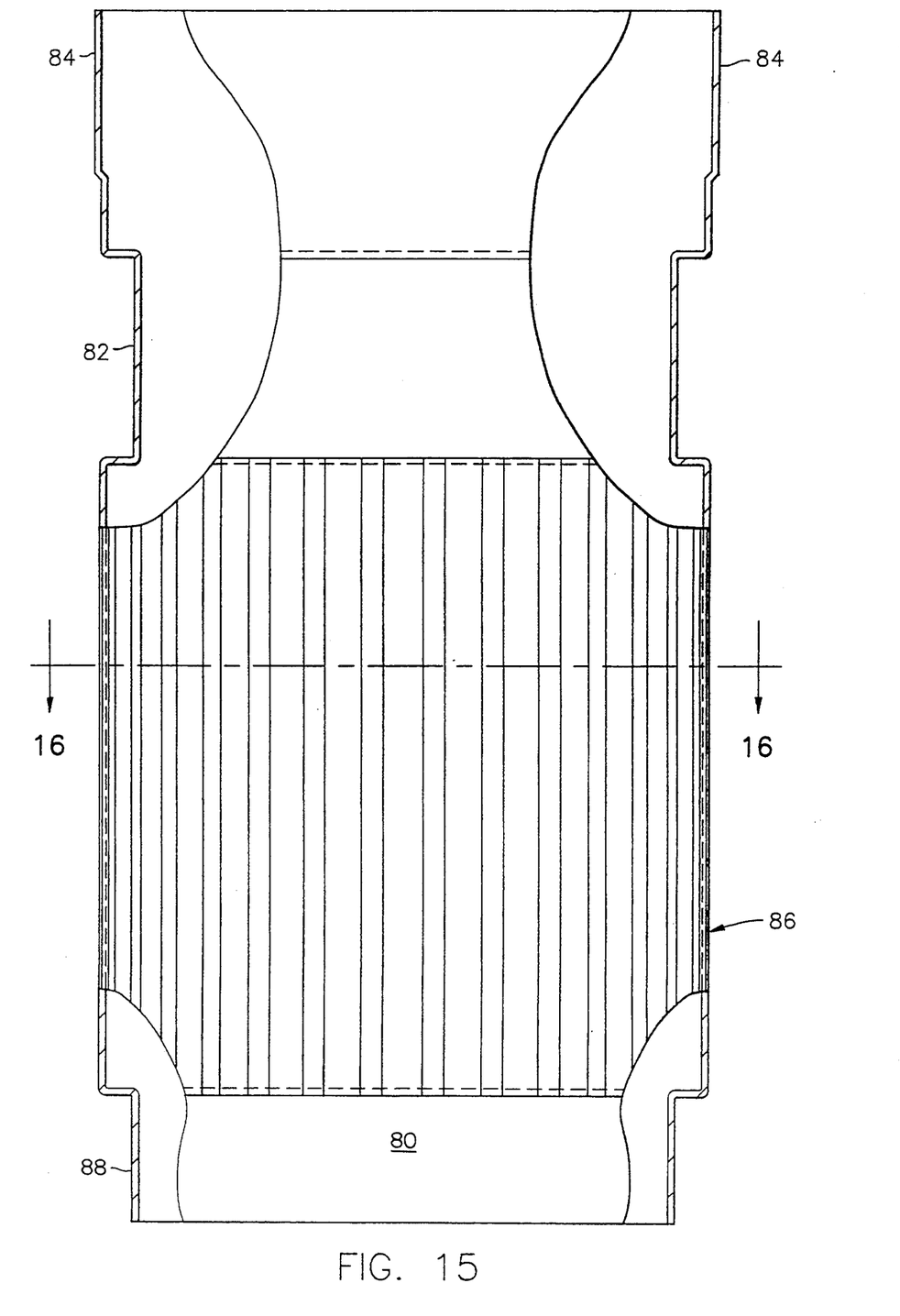
FIG. 15 is a view in side elevation and partial section of the cold end channel according to the present invention.
Figure 16:
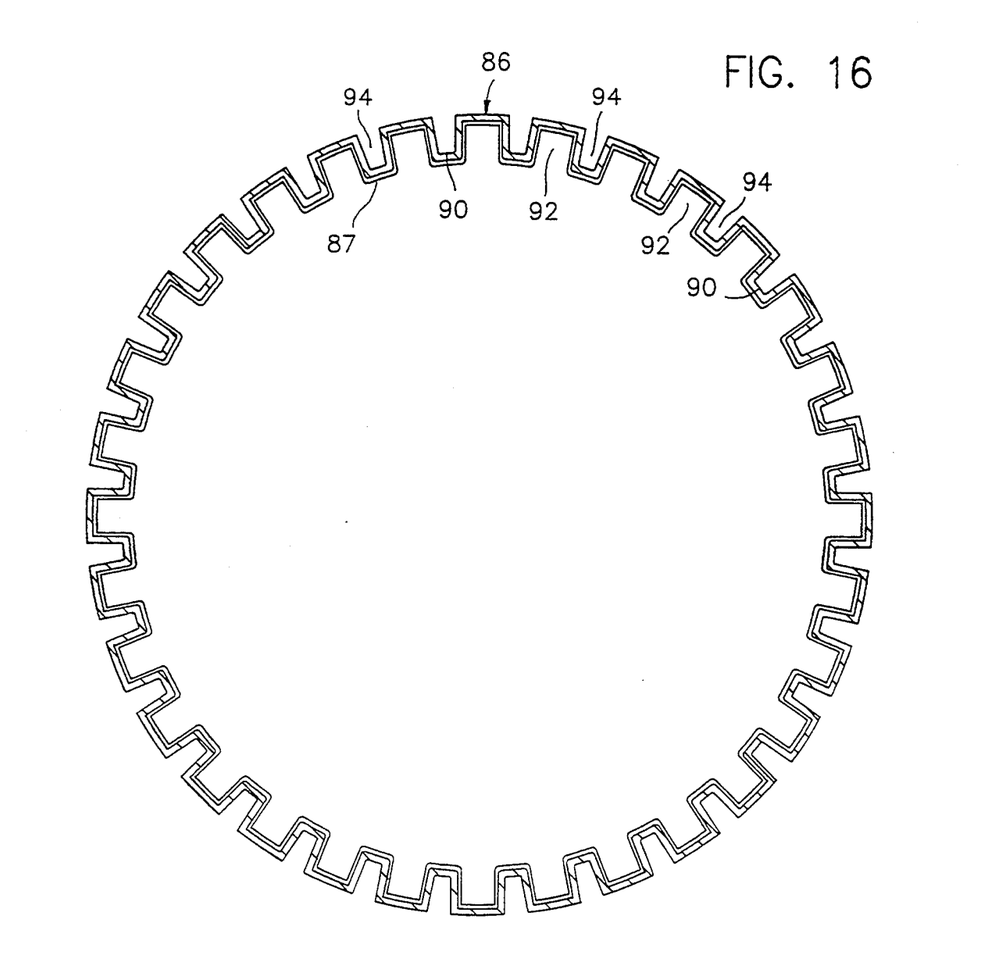
FIG. 16 is a view in section taken along line 16—16 of FIG. 15.
Figure 17:
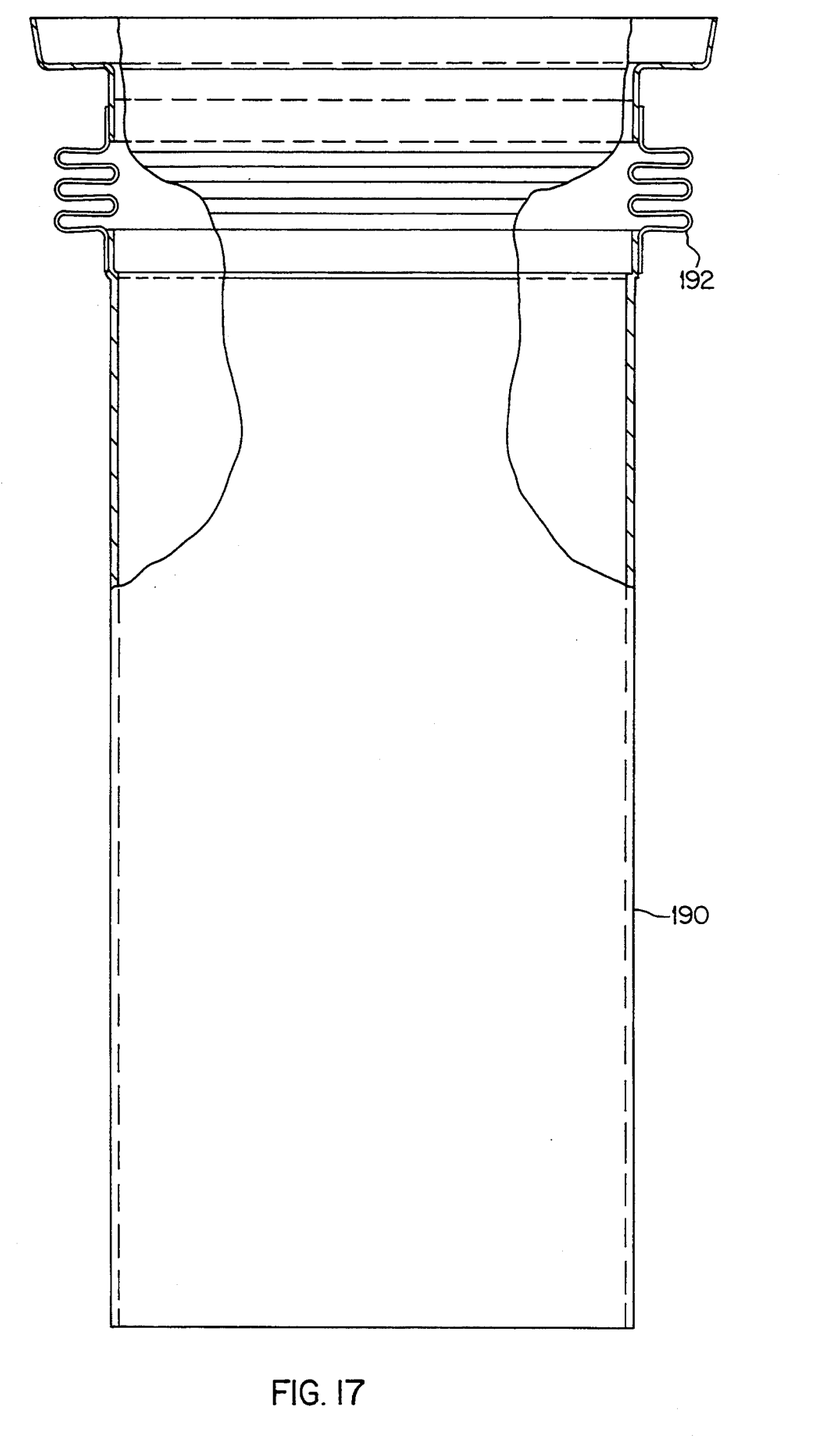
FIG. 17 is a view in elevation, partly in section, showing the hot frame according to the present invention.

Spring retainer strip 120 is shown in detail in FIGS. 12–14 and consists of a single molded piece of plastic (electrically insulating material) having a flat narrow top 170, a series of depending flanges 172 and either one or two depending cylindrical projections 178 between each pair of adjacent depending flanges. The top 170 is narrower than the width of the followers 116, 117 and the flanges 172 are tapered to be wider at their free ends. This feature serves to guide and center the assembled rows into the corrugations in the cold end channel 92. The end flanges electrically isolate the end followers 116 from the shoulders 89 of the cold end frame 86 and the remaining flanges 172 fit between and electrically isolate each end follower 116 from its adjacent double follower 117 and fit between and electrically isolate adjacent double followers 117. Each cylindrical projection 178 terminates in a beveled free end 180 and has four radially projecting ribs 182 with tapered ends 184 uniformly spaced about its periphery. The strip 120 serves to retain springs in their respective associated recesses in followers 116, 117 and electrically insulate the followers and springs from the cold end frame 80. The projections 178 each are aligned and registered to be received in an associated spring 118 with ribs 182 serving to detachably connect the strip 120 and springs together. The subassembly is now an integrated row which can be handled and installed as a unit. Strip 110 is bonded to hot shoes 112 which are bonded to thermoelectric elements 114 which are bonded to followers 116, 117 which capture and hold springs 118 which receive and hold the strip 120.

As shown in the FIG. 4 of drawings, 32 rows 96 are installed in the electrically insulated coated channels 92 of the cold end frame 80 by fitting the followers 116, 117, with springs 118 and strip 120 mounted thereon, into channels 92. The generator 38 is completed by pressing strips 110 radially outwardly thereby compressing springs 118 radially outwardly into channels 92 and inserting hot frame 190, a cylinder, into the space created radially inwardly of the rows. The forward end of hot frame cylinder 190 is provided with an integral bellows 192 to compensate for thermal expansion and contraction. The front end of cylinder 190 is hermetically sealed at its junction with cold end channel 80 at 216 (see FIG. 3). The rear of cylinder 190 is hermetically sealed to the cold side frame 80 by resilient bent thin plates 196, 198 sealed together and to the heat exchanger at 197 to create an annular space, hermetically sealed, in which the rows are located and protected. A baffle 201 sealed to the joint of plates 196, 198 extends into the gas flow annular space to direct hot gases into the heat exchanger 60. A baffle plate 203 is fixed to mantle 39 to prevent backflow of combustion gasses. The pressure on the rows is accomplished by the springs 118 which urge the strips 110 against the periphery of hot frame cylinder 190 for good heat transfer.

Adjacent rows of subassemblies are interconnected by electrical conductors 119 such as wires, strips or ribbons of copper wire, bonded to the terminals 150 at alternating ends of in adjacent rows. There are 32 rows distributed about the 32 channels 92 in the cold end frame 80. One side of rows 1 and 32 constitute the output for the generator or converter and leads 210, 211 connected to terminals 150 of the same end of rows 1 and 32 are taken through a conventional feed through 214 to the outside. The follower 116 at the other end of row 1 is connected by conductor 119 to adjacent follower 116 of row 2 and so forth in a back and forth manner until all rows and all thermoelectric elements 114 are connected in series. The converter, after assembly and welding, brazing or otherwise sealing, of the converter chamber 215 is thermally insulated internally by evacuating the chamber 215 using out gas and backfill tubes and backfilling chamber 215 with a specially prepared powder thermal insulation and inert gas mixture. This is accomplished by evacuating through one tube and opening a cannister of specially conditioned powder insulation connected to another tube leading into chamber 215. Both tubes are subsequently pinched off and seal welded after the fill is completed. The operation of the heater mechanism will now be described in detail.

Air is drawn into compartment 34 via air pipe 42 by fan 48 and is directed into combustion chamber 36 where it is mixed with fuel being delivered via line 50 to the combustion chamber 36. Paddle wheel 52 or any like device serves to create an appropriate air-fuel mixture. Ignition device 58 fires the air-fuel mixture and combustion gases pass through hot frame cylinder 190 of generator 38, heat exchanger 40 and are exhausted through outlet 62. Cold water is pumped through inlet 66 via water inlet pipe 230 and flows through heat exchanger 40 and troughs 94 on the cold side of the generator 38 to be in parallel heat exchange with the rows or subassemblies 96 in particular followers 116, 117, and then exits via outlet 68 and outlet pipe 104, see FIG. 2.

Heat flows radially outwardly through the thermoelectric converter and then peripherally to the coolant, such as, cold water flowing through the troughs 94. Because of the temperature difference between the two sides of the thermoelectric converter and its properties, electricity is generated and taken out by leads 210, 211 which are connected in a conventional circuit to supply power to motors 46, 56, 72 and 75 and to recharge battery 76. In the specific example given above, the generator 38 is designed to operate at from about 14.2 to about 14.6 volts to keep battery 76 (which can be a conventional 12 volt automotive battery) fully charged.

The foregoing description is intended by way of example only and is not intended to limit the present invention in any way regarding the following claims.

We claim:

1. A self powered heater system for heating an enclosure comprising:
   a housing;
   air means for supplying air into the housing including a first electric motor for moving the air;
   fuel means for delivering fuel from a fuel storage container to the housing including a second electric motor for pumping the fuel;
   combustion means for mixing the fuel delivered by said fuel means and the air supplied by said air means, and for igniting the mixture of fuel and air to obtain hot combustion gases;
   thermoelectric converter means mounted in the housing for generating electricity by receiving the hot combustion gases and extracting heat therefrom, said thermoelectric converter means having a structure to allow both series and parallel heat flow paths;
   cooling means for circulating a liquid coolant adjacent to said thermoelectric converter means to remove heat from said thermoelectric converter means, thereby heating said liquid coolant;
   an enclosure heat transfer means for blowing air over said liquid coolant to heat the air and for directing the air into an enclosure, said enclosure heat transfer means including a third electric motor; and
   battery means, connected to the first, second, and third electric motors and said thermoelectric converter means, for operating the first, second, and third electric motors during a start-up period of the heater system and for receiving a charging current to recharge said battery means from said thermoelectric converter means after the expiration of said start-up period, said thermoelectric converter means also providing electricity to operate said first, second, and third electric motors after the expiration of said start-up period.

2. A heater system as claimed in claim 1, wherein the air means comprises an air pipe; and a fan driven by the first electric motor for drawing air through the air pipe into the housing.

3. A heater system as claimed in claim 1, wherein the fuel means comprises:

a fuel pipe connected to the fuel storage container; and pump means driven by the second electric motor for pumping fuel through the fuel pipe into the housing.

4. A heater system as claimed in claim 1, wherein the combustion means comprises:

paddle means for receiving the delivered fuel and for mixing the fuel with air; and ignition means for igniting the mixture of air and fuel.

5. A heater system as claimed in claim 1, wherein the thermoelectric converter means comprises:

a cylindrical cold end frame defining a plurality of axially extended corrugations defining alternately inwardly and outwardly radially facing channels;

a plurality of thermoelectric row assemblies each having a cold side and a hot side, each said row having its cold side being received in an inwardly facing channel in electrical isolation therewith; and a hot frame in good thermal contact with but electrically isolated from the hot side of each of said assemblies.

6. A heater system as claimed in claim 5, wherein each of the plurality of row assemblies comprises:

a plurality of hot shoes;

a pair of thermoelectric elements mounted on one face on each hot shoe;

a plurality of electrically conductive followers mounted to the other faces of the thermoelectric elements;

spring means mounted in said followers for urging said assemblies against said hot frame; and dielectric means interposed between said hot shoes and said hot frame for electrically isolating said hot shoes from said hot frame.

7. A heater system as claimed in claim 5, wherein the cooling means comprises:

coolant introduction means including a fourth electric motor driving a pump for introducing the liquid coolant into the housing; and means for passing the liquid coolant through the axially extending radially outwardly facing channels of the cold end frame.

8. A heater system as claimed in claim 7, wherein means are provided for supplying the electricity generated by the thermoelectric converter means to the fourth electric motor of the cooling means.

* * * * *